(12) United States Patent
Basin et al.

(10) Patent No.: US 7,452,737 B2
(45) Date of Patent: Nov. 18, 2008

(54) MOLDED LENS OVER LED DIE

(75) Inventors: Grigoriy Basin, San Francisco, CA (US); Robert Scott West, Morgan Hill, CA (US); Paul S. Martin, Pleasanton, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 22 days.

(21) Appl. No.: 10/990,208

(22) Filed: Nov. 15, 2004

(65) Prior Publication Data
US 2006/0105484 A1 May 18, 2006

(51) Int. Cl.
*H01L 21/00* (2006.01)
(52) U.S. Cl. .................. 438/27; 438/26; 257/E33.058
(58) Field of Classification Search ............. 438/26–27, 438/28; 257/98–100
See application file for complete search history.

(56) References Cited

U.S. PATENT DOCUMENTS

| | | | |
|---|---|---|---|
| 5,435,953 | A | 7/1995 | Osada et al. |
| 5,507,633 | A | 4/1996 | Osada et al. |
| 5,603,879 | A | 2/1997 | Osada et al. |
| 5,753,538 | A | 5/1998 | Kuno et al. |
| 5,834,035 | A | 11/1998 | Osada et al. |
| 6,274,399 | B1 | 8/2001 | Kern et al. |
| 6,274,924 | B1 | 8/2001 | Carey et al. |
| 6,576,488 | B2 | 6/2003 | Collins, III et al. |
| 6,649,440 | B1 | 11/2003 | Krames et al. |
| 6,653,157 | B2 * | 11/2003 | Kondo .......................... 438/22 |
| 6,682,331 | B1 * | 1/2004 | Peh et al. ..................... 425/112 |
| 6,977,188 | B2 | 12/2005 | Takase |
| 2001/0026011 | A1 * | 10/2001 | Roberts et al. .............. 257/678 |
| 2001/0042865 | A1 * | 11/2001 | Oshio et al. ................. 257/100 |

(Continued)

FOREIGN PATENT DOCUMENTS

JP 05-19705 * 1/1993

OTHER PUBLICATIONS

"Slide-Emitting Optic," Carclo Precision Optics data sheet, downloaded from www.carclo-optics.com, 2 pages.
FFT Flow Free Thin Molding System, Towa Corporation ad., 2 pages.

*Primary Examiner*—Bradley W. Baumeister
*Assistant Examiner*—Matthew L Reames
(74) *Attorney, Agent, or Firm*—Patent Law Group LLP; Brian D. Ogonowsky

(57) ABSTRACT

One or more LED dice are mounted on a support structure. The support structure may be a submount with the LED dice already electrically connected to leads on the submount. A mold has indentations in it corresponding to the positions of the LED dice on the support structure. The indentations are filled with a liquid optically transparent material, such as silicone, which when cured forms a lens material. The shape of the indentations will be the shape of the lens. The mold and the LED dice/support structure are brought together so that each LED die resides within the liquid silicone in an associated indentation. The mold is then heated to cure (harden) the silicone. The mold and the support structure are then separated, leaving a complete silicone lens over each LED die. This over molding process may be repeated with different molds to create concentric shells of lenses. Each concentric lens may have a different property, such as containing a phosphor.

16 Claims, 5 Drawing Sheets

U.S. PATENT DOCUMENTS

2004/0227149 A1 11/2004 Ibbetson et al.
2005/0224829 A1* 10/2005 Negley et al. ................ 257/99
2006/0006404 A1* 1/2006 Ibbetson et al. ............... 257/99
2006/0091418 A1* 5/2006 Chew ........................ 257/100

* cited by examiner

MOLDED LENS OVER LED DIE

FIELD OF THE INVENTION

This invention relates to light emitting diodes (LEDs) and, in particular, to a technique for forming a lens over an LED die.

BACKGROUND

LED dies typically emit light in a Lambertian pattern. It is common to use a lens over the LED die to narrow the beam or to make a side-emission pattern. A common type of lens for a surface mounted LED is preformed molded plastic, which is bonded to a package in which the LED die is mounted. One such lens is shown in U.S. Pat. No. 6,274,924, assigned to Lumileds Lighting and incorporated herein by reference.

SUMMARY

A technique for forming a lens for surface mounted LEDs is described herein.

One or more LED dice are mounted on a support structure. The support structure may be a ceramic substrate (a submount) or other type of support structure with the LED dice electrically connected to metal pads on the support structure.

A mold has indentations in it corresponding to the positions of the LED dice on the support structure. The indentations are filled with a liquid, optically transparent material, such as silicone, which when cured forms a hardened lens material. The shape of the indentations will be the shape of the lens. The mold and the LED dice/support structure are brought together so that each LED die resides within the liquid lens material in an associated indentation.

The mold is then heated to cure (harden) the lens material. The mold and the support structure are then separated, leaving a complete lens over each LED die. This general process will be referred to as over molding.

The over molding process may be repeated with different molds to create concentric shells of lenses. Each lens may have a different property, such as containing a phosphor.

DETAILED DESCRIPTION

As a preliminary matter, a conventional LED is formed on a growth substrate. In the example used, the LED is a GaN-based LED, such as an AlInGaN LED, for producing blue or UV light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

Various techniques are used to gain electrical access to the n-layers. In a flip-chip example, portions of the p-layers and active layer are etched away to expose an n-layer for metallization. In this way the p contact and n contact are on the same side of the chip and can be directly electrically attached to the package (or submount) contact pads. Current from the n-metal contact initially flows laterally through the n-layer. In contrast, in a vertical injection (non-flip-chip) LED, an n-contact is formed on one side of the chip, and a p-contact is formed on the other side of the chip. Electrical contact to one of the p or n-contacts is typically made with a wire or a metal bridge, and the other contact is directly bonded to a package (or submount) contact pad. A flip-chip LED is used in the examples of FIGS. 1-3 for simplicity.

Examples of forming LEDs are described in U.S. Pat. Nos. 6,649,440 and 6,274,399, both assigned to Lumileds Lighting and incorporated by reference.

Optionally, a conductive substrate is bonded to the LED layers (typically to the p-layers) and the sapphire substrate is removed. One or more LED dice may be bonded to a submount, with the conductive substrate directly bonded to the submount, to be described in greater detail with respect to FIGS. 5 and 6. One or more submounts may be bonded to a printed circuit board, which contains metal leads for connection to other LEDs or to a power supply. The circuit board may interconnect various LEDs in series and/or parallel.

The particular LEDs formed and whether or not they are mounted on a submount is not important for purposes of understanding the invention.

Figure 1:
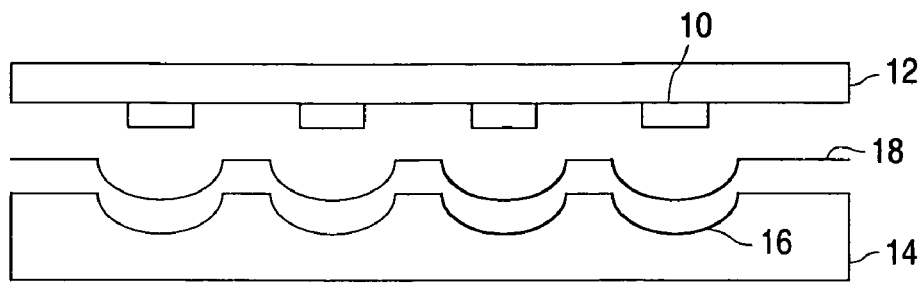
FIG. 1 is a side view of four LED dice mounted on a support structure, such as a submount, and a mold for forming a lens around each LED die.

FIG. 1 is a side view of four LED dice 10 mounted on a support structure 12. The support structure may be a submount (e.g., ceramic or silicon with metal leads), a metal heat sink, a printed circuit board, or any other structure. In the present example, the support structure 12 is a ceramic submount with metal pads/leads.

A mold 14 has indentations 16 corresponding to the desired shape of a lens over each LED die 10. Mold 14 is preferably formed of a metal. A very thin non-stick film 18, having the general shape of mold 14, is placed over mold 14. Film 18 is of a well known conventional material that prevents the sticking of silicone to metal.

Figure 2:
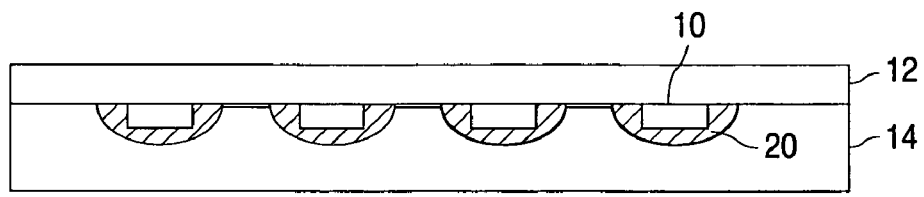
FIG. 2 is a side view of the LED dice being inserted into indentations in the mold filled with a liquid lens material.

In FIG. 2, the mold indentions 16 have been filled with a heat-curable liquid lens material 20. The lens material 20 may be any suitable optically transparent material such as silicone or an epoxy. Silicone has a sufficiently high index of refraction (e.g., 1.76) to greatly improve the light extraction from an AlInGaN or AlInGaP LED as well as act as a lens.

A vacuum seal is created between the periphery of the support structure 12 and mold 14, and the two pieces are pressed against each other so that each LED die 10 is inserted into the liquid lens material 20 and the lens material 20 is under compression.

The mold is then heated to about 150 degrees centigrade (or other suitable temperature) for a time to harden the lens material 20.

The support structure 12 is then separated from mold 14. Film 18 causes the resulting hardened lens to be easily released from mold 14. Film 18 is then removed.

Figure 3:
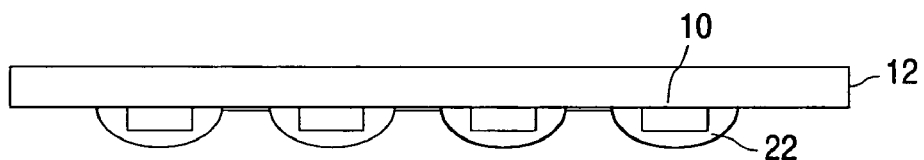
FIG. 3 is a side view of the LED dice removed from the mold after the liquid has been cured, resulting in a lens encapsulating each LED die.

FIG. 3 illustrates the resulting structure with a molded lens 22 over each LED die 10. In one embodiment, the molded lens is between 1 mm and 5 mm in diameter. The lens 22 may be any size.

Figure 4:
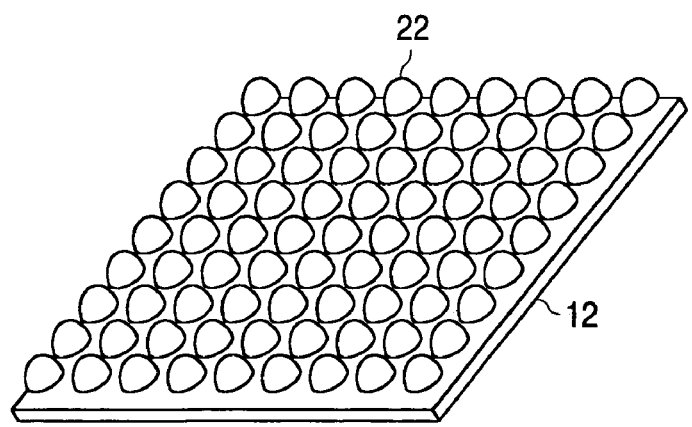
FIG. 4 is a perspective view of an array of LED dice on a submount or circuit board with a molded lens formed over each LED die.

FIG. 4 is a perspective view of a resulting structure where the support structure 12 supports an array of LED dice, each having a molded lens 22. The mold used would have a corresponding array of indentations. If the support structure 12 were a ceramic or silicon submount, each LED (with its underlying submount portion) can be separated by sawing or breaking the submount 12 to form individual LED dice. Alternatively, the support structure 12 may be separated/diced to support subgroups of LEDs or may be used without being separated/diced.

The lens 22 not only improves the light extraction from the LED die and refracts the light to create a desired emission pattern, but the lens also encapsulates the LED die to protect the die from contaminants, add mechanical strength, and protect any wire bonds.

Figure 5:
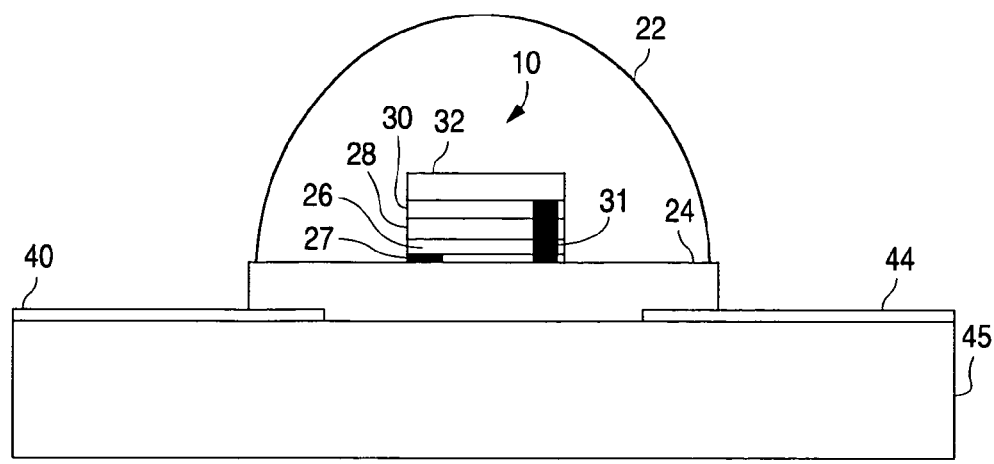
FIG. 5 is a close-up side view of a flip-chip LED die mounted on a submount, which is, in turn, mounted on a circuit board, and where a molded lens is formed over the LED die.

FIG. 5 is a simplified close-up view of one embodiment of a single flip-chip LED die 10 on a submount 24 formed of any suitable material, such as a ceramic or silicon. In one embodiment, submount 24 acted as the support structure 12 in FIGS. 1-4, and the die/submount of FIG. 5 was separated from the structure of FIG. 4 by sawing. The LED die 10 of FIG. 5 has a bottom p-contact layer 26, a p-metal contact 27, p-type layers 28, a light emitting active layer 30, n-type layers 32, and an n-metal contact 31 contacting the n-type layers 32. Metal pads on submount 24 are directly metal-bonded to contacts 27 and 31. Vias through submount 24 terminate in metal pads on the bottom surface of submount 24, which are bonded to the metal leads 40 and 44 on a circuit board 45. The metal leads 40 and 44 are connected to other LEDs or to a power supply. Circuit board 45 may be a metal plate (e.g., aluminum) with the metal leads 40 and 44 overlying an insulating layer. The molded lens 22, formed using the technique of FIGS. 1-3, encapsulates the LED die 10.

The LED die 10 in FIG. 5 may also be a non-flip-chip die, with a wire connecting the top n-layers 32 to a metal pad on the submount 24. The lens 22 may encapsulate the wire.

Figure 6:
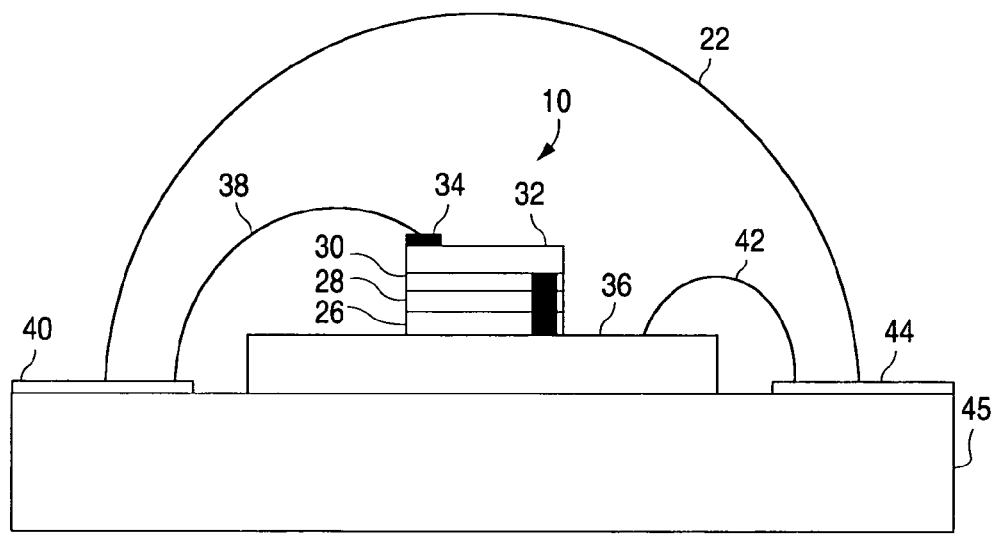
FIG. 6 is a close-up side view of a non-flip-chip LED die mounted on a submount, which is, in turn, mounted on a circuit board, where wires electrically connect n and p metal on the LED die to leads on the circuit board, and where a molded lens is formed over the LED die.

In one embodiment, the circuit board 45 itself may be the support structure 12 of FIGS. 1-3. Such an embodiment is shown in FIG. 6. FIG. 6 is a simplified close-up view of a non-flip-chip LED die 10 having a top n-metal contact 34 connected to a metal lead 40 on circuit board 45 by a wire 38. The LED die 10 is mounted on a submount 36, which in the example of FIG. 6 is a metal slab. A wire 42 electrically connects the p-layers 26/28 to a metal lead 44 on circuit board 45. The lens 22 is shown completely encapsulating the wires and submount 36; however, in other embodiments the entire submount or the entire wire need not be encapsulated.

A common prior art encapsulation method is to spin on a protective coating. However, that encapsulation process is inappropriate for adding a phosphor coating to the LED die since the thickness of the encapsulant over the LED die is uneven. Also, such encapsulation methods do not form a lens. A common technique for providing a phosphor over the LED die is to fill a reflective cup surrounding the LED die with a silicone/phosphor composition. However, that technique forms a phosphor layer with varying thicknesses and does not form a suitable lens. If a lens is desired, additional processes still have to create a plastic molded lens and affix it over the LED die.

FIGS. 7-11 illustrate various lenses that may be formed using the above-described techniques.

Figure 7:
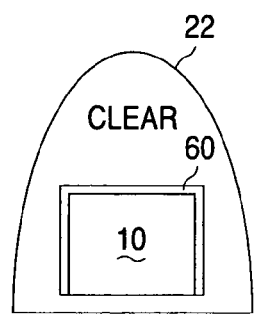
FIGS. 7, 8, 9, 10, and 11 are cross-sectional views of an LED die with different lenses formed over it.
Figure 8:
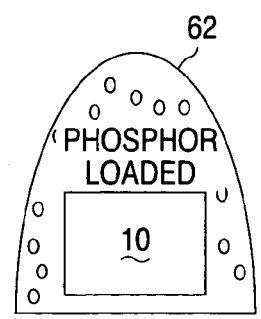

FIG. 7 illustrates an LED die 10 that has been coated with a phosphor 60 using any suitable method. One such method is by electrophoresis, described in U.S. Pat. No. 6,576,488, assigned to Lumileds Lighting and incorporated herein by reference. Suitable phosphors are well known. A lens 22 is formed using the techniques described above. The phosphor 60 is energized by the LED emission (e.g., blue or UV light) and emits light of a different wavelength, such as green, yellow, or red. The phosphor emission alone or in conjunction with the LED emission may produce white light.

Processes for coating an LED with a phosphor are time-consuming. To eliminate the process for coating the LED die with a phosphor, the phosphor powder may be mixed with the liquid silicone so as to become embedded in the lens 62, shown in FIG. 8.

Figure 9:
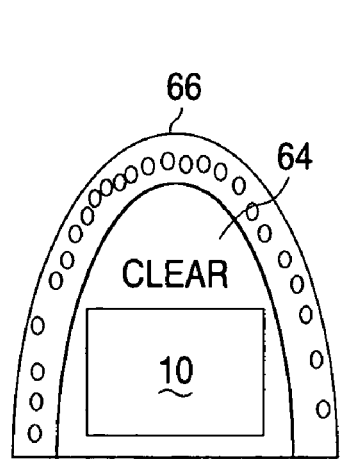

As shown in FIG. 9, to provide a carefully controlled thickness of phosphor material over the LED die, an inner lens 64 is formed using the above-described techniques, and a separate molding step (using a mold with deeper and wider indentations) is used to form an outer phosphor/silicone shell 66 of any thickness directly over the inner lens 64.

Figure 10:
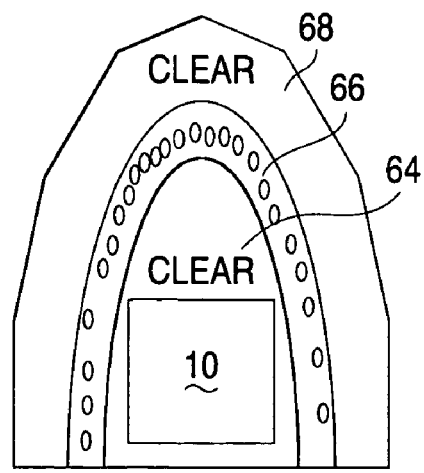

FIG. 10 illustrates an outer lens 68 that may be formed over the phosphor/silicone shell 66 using another mold to further shape the beam.

Figure 11:
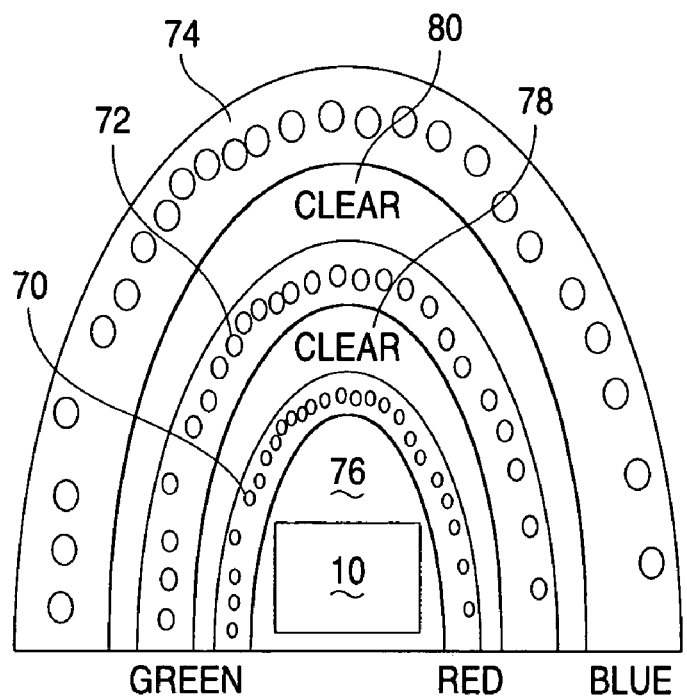

FIG. 11 illustrates shells 70, 72, and 74 of red, green, and blue-emission phosphors, respectively, overlying clear silicone shells 76, 78, and 80. In this case, LED die 10 emits UV light, and the combination of the red, green, and blue emissions produces a white light. All shells are produced with the above-described methods.

Figure 12:
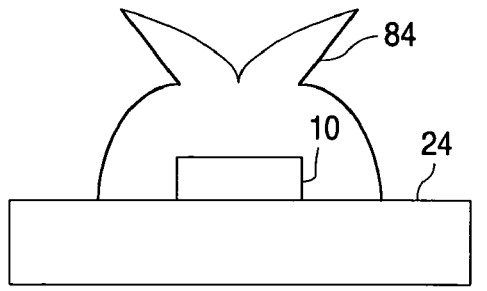
FIG. 12 is a cross-sectional view of a side-emitting lens molded onto the LED die using the inventive techniques.

Many other shapes of lenses can be formed using the molding technique described above. FIG. 12 is a cross-sectional view of LED 10, submount 24, and a molded side-emitting lens 84. In one embodiment, lens 84 is formed of a very flexible material, such as silicone, which flexes as it is removed from the mold. When the lens is not a simple shape, the release film 18 (FIG. 1) will typically not be used.

Figure 13:
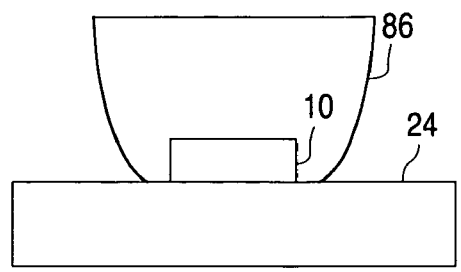
FIG. 13 is a cross-sectional view of a collimating lens molded onto the LED die using the inventive techniques.

FIG. 13 is a cross-sectional view of LED 10, submount 24, and a molded collimating lens 86.

Figure 14:
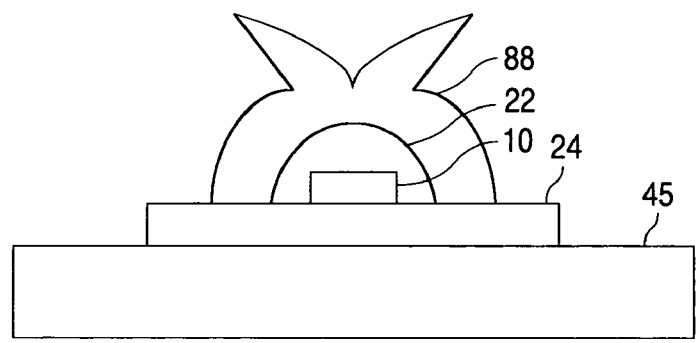
FIG. 14 is a cross-sectional view of a preformed side-emitting lens affixed over a lambertian lens that has been molded onto the LED die using the inventive techniques.

FIG. 14 illustrates how a preformed lens 88 can be affixed over a molded lambertian lens 22. In the example of FIG. 14, lens 22 is formed in the previously described manner. Lens 22 serves to encapsulate and protect LED 10 from contaminants. A preformed side-emitting lens 88 is then affixed over lens 22 using a UV curable adhesive or a mechanical clamp. This lens-forming technique has advantages over conventional techniques. In a conventional technique, a preformed lens (e.g., a side emitting lens) is adhesively affixed over the LED die, and any gaps are filled in by injecting silicone. The conventional process is difficult to perform due to, among other reasons, carefully positioning the separated die/submount for the lens placement and gap-filling steps. Using the inventive technique of FIG. 14, a large array of LEDs (FIG. 4) can be encapsulated simultaneously by forming a molded lens over each. Then, a preformed lens 88 can be affixed over each molded lens 22 while the LEDs are still in the array (FIG. 4) or after being separated.

Additionally, the molded lens can be made very small (e.g., 1-2 mm diameter), unlike a conventional lens. Thus, a very small, fully encapsulated LED can be formed. Such LEDs can be made to have a very low profile, which is beneficial for certain applications.

FIG. 14 also shows a circuit board 45 on which submount 24 is mounted. This circuit board 45 may have mounted on it an array of LEDs/submounts 24.

Figure 15:
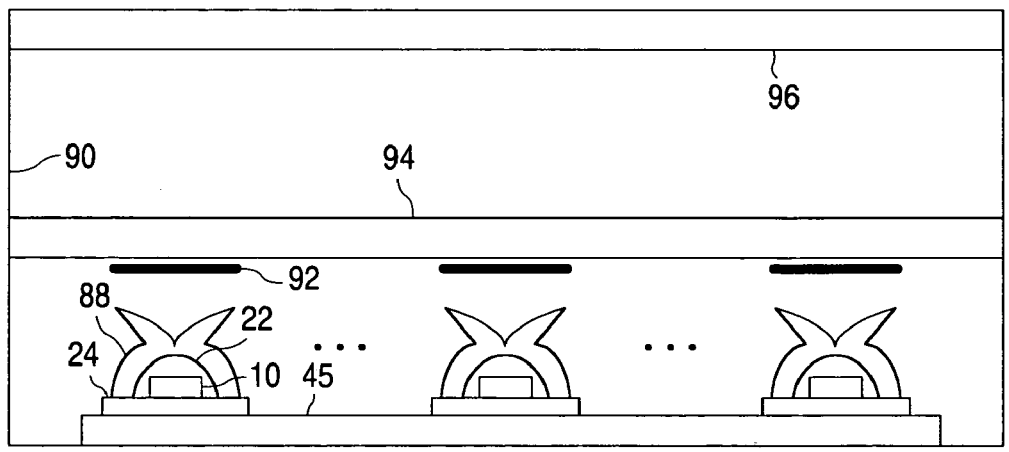
FIG. 15 is a cross-sectional view of a backlight for a liquid crystal display or other type of display using the LED and side-emitting lens of FIG. 14.

FIG. 15 is a cross-sectional view of a backlight for a liquid crystal display (LCD) or other display that uses a backlight. Common uses are for televisions, monitors, cellular phones, etc. The LEDs may be red, green, and blue to create white light. The LEDs form a two-dimensional array. In the example shown, each LED structure is that shown in FIG. 14, but any suitable lens may be used. The bottom and sidewalls 90 of the backlight box are preferably coated with a white reflectively-diffusing material. Directly above each LED is a white diffuser dot 92 to prevent spots of light from being emitted by the backlight directly above each LED. The dots 92 are supported by a transparent or diffusing PMMA sheet 94. The light emitted by the side-emitting lenses 88 is mixed in the lower portion of the backlight, then further mixed in the upper portion of the backlight before exiting the upper diffuser 96. Linear arrays of LEDs may be mounted on narrow circuits boards 45.

Figure 16:
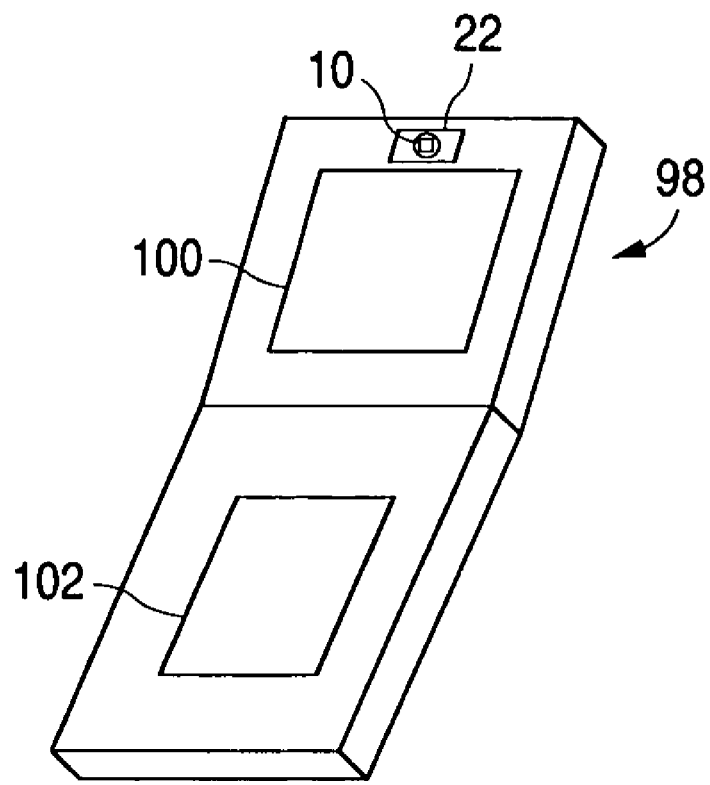
FIG. 16 is a perspective view of a cell phone with a camera that uses as a flash an LED with a molded lens.

FIG. 16 illustrates an LED 10 with a molded lens 22 being used as a flash in a camera. The camera in FIG. 16 is part of a cellular telephone 98. The cellular telephone 98 includes a color screen 100 (which may have a backlight using the LEDs described herein) and a keypad 102.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming an optical element over a light emitting diode (LED) die comprising:
   providing a plurality of non-encapsulated LED dies mounted on a single submount support structure, the support structure having metal leads in electrical contact with metal contacts on each LED die, the LED dies forming a two-dimensional pattern on the support structure;
   providing a first mold having indentations corresponding to the pattern of LED dies on the support structure;
   filling the indentations in the first mold with a liquid first lens material prior to the LEDs dies being positioned within the indentations;
   bringing the first mold and the support structure together so that the LED dies are within the liquid first lens material so as to directly contact the liquid lens material;
   curing the liquid first lens material until it hardens;
   removing the support structure from the first mold so that a first lens formed from the hardened first lens material overlies each of the LED dies and fully encapsulates each of the LED dies; and
   singulating the submount support structure into portions, wherein mounted on each portion is at least one encapsulated LED die.

2. A method for forming an optical element over a light emitting diode (LED) die comprising:
   providing a plurality of non-encapsulated LED dies mounted on a single submount support structure, the support structure having metal leads in electrical contact with metal contacts on each LED die, the LED dies forming a two-dimensional pattern on the support structure;
   providing a first mold having indentations corresponding to the pattern of LED dies on the support structure, wherein there are no liquid flow channels between the indentations;
   filling the indentations in the first mold with a liquid first lens material prior to the LEDs dies being positioned within the indentations;
   bringing the first mold and the support structure together so that the LED dies are within the liquid first lens material so as to directly contact the liquid lens material;
   curing the liquid first lens material until it hardens;
   removing the support structure from the first mold so that a first lens formed from the hardened first lens material overlies each of the LED dies and fully encapsulates each of the LED dies; and
   singulating the submount support structure into portions, wherein mounted on each portion is at least one encapsulated LED die.

3. The method of claim 2 wherein the liquid first lens material comprises silicone.

4. The method of claim 1 wherein the LED die is a flip-chip with metal contacts directly bonded to the metal leads of the submount.

5. The method of claim 1 wherein the LED die has a phosphor material coating at least one surface of the LED die.

6. The method of claim 1 further comprising:
   providing a second mold having a second indentation filled with a liquid second lens material;
   bringing together the second mold and the support structure, having attached to it the LED die having the first lens, so that the first lens is within the liquid second lens material in the second indentation;
   curing the liquid second lens material until it hardens; and
   removing the support structure from the second mold so that the hardened second lens material forms a first shell over the first lens.

7. The method of claim 6 wherein the second lens material comprises a first phosphor material.

8. The method of claim 6 wherein the second lens material is different from the first lens material.

9. The method of claim 6 wherein the second lens material comprises a first phosphor material, wherein a light emission from the combination of the LED die and first phosphor material is a white light.

10. The method of claim 6 wherein the second lens material comprises a first phosphor material, the method further comprising:
   providing a third mold having a third indentation filled with a liquid third lens material;
   bringing together the third mold and support structure, having attached to it the LED die having the first shell over the first lens;
   curing the liquid third lens material until it hardens; and
   removing the support structure from the third mold so that the hardened third lens material forms a second shell over the first shell.

11. The method of claim 10 further comprising:
providing a fourth mold having a fourth indentation filled with a liquid fourth lens material, the fourth lens material comprising a second phosphor;
bringing together the fourth mold and support structure, having attached to it the LED die having the second shell over the first shell;
curing the liquid fourth lens material until it hardens; and
removing the support structure from the fourth mold so that the hardened fourth lens material forms a third shell over the second shell.

12. The method of claim 11 further comprising forming a fourth shell containing a third phosphor material overlying the third shell so that a light emission from the combination of the LED die, the first phosphor material, the second phosphor material, and the third phosphor material is a white light.

13. The method of claim 1 wherein the LED die is a flip-chip.

14. The method of claim 1 wherein the LED die has at least one wire bond electrically connecting the LED die to the support structure.

15. The method of claim 1 wherein the liquid first lens material comprises at least one type of phosphor.

16. The method of claim 1 wherein the liquid first lens material comprises at least one type of phosphor such that the phosphor emission alone or in conjunction with the LED emission produces white light.

* * * * *